US010801969B1

(12) United States Patent
Yuen

(10) Patent No.: US 10,801,969 B1
(45) Date of Patent: Oct. 13, 2020

(54) TESTING DEVICE FOR BOTTOM-EMITTING OR BOTTOM-DETECTING OPTICAL DEVICES

(71) Applicant: Lumentum Operations LLC, Milpitas, CA (US)

(72) Inventor: Albert Yuen, Palo Alto, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 16/694,762

(22) Filed: Nov. 25, 2019

Related U.S. Application Data

(60) Provisional application No. 62/899,540, filed on Sep. 12, 2019.

(51) Int. Cl.
  *G01B 11/00* (2006.01)
  *G01N 21/95* (2006.01)
  *G01N 21/01* (2006.01)
(52) U.S. Cl.
  CPC ......... *G01N 21/9501* (2013.01); *G01N 21/01* (2013.01); *G01N 2021/0112* (2013.01)
(58) Field of Classification Search
  CPC .............. G01R 19/165; G01R 19/0092; G01R 31/2886; G01R 31/318536; G01R 31/3842; G01R 19/10; G01R 1/07342; G01R 31/2875; G01R 31/2877; G01R 31/3177; G01R 31/374; G01R 31/3835; G01R 31/389; G01R 31/396; G01R 31/50; G01R 31/58; G01R 31/68; G01R 13/0272; G01R 15/148; G01R 19/04; G01R 19/16504; G01R 1/06794; G01R 1/07371; G01R 21/00; G01R 27/2605; G01R 27/2623; G01R 27/28; G01R 29/0842; G01R 29/12; G01R 29/24; G01R 29/26; G01R 31/003; G01R 31/2822; G01R 31/2824; G01R 31/2851; G01R 31/2874; G01R 31/2884; G01R 31/309; G01R 31/31705; G01R 31/31706; G01R 31/31717; G01R 31/31718; G01R 31/3172; G01R 31/31723; G01R 31/318511; G01R 31/318513; G01R 31/31855; G01R 31/318577; G01R 31/3187; G01R 31/327; G01R 31/385; G01R 31/3865; G01R 31/388;
(Continued)

(56) References Cited

U.S. PATENT DOCUMENTS

2003/0042889 A1\* 3/2003 Harris ................. G01R 1/0408
324/750.2

\* cited by examiner

*Primary Examiner* — Mesfin T Asfaw
(74) *Attorney, Agent, or Firm* — Harrity & Harrity, LLP

(57) ABSTRACT

A testing device for bottom-emitting or bottom-detecting optical devices may comprise a support structure to support a lower transparent chuck and an upper transparent chuck that includes a set of vacuum holes. In some implementations, a vacuum may be formed in a space between the lower transparent chuck and the upper transparent chuck when a vacuum pump is applied to an opening in a sidewall of the support structure. For example, the vacuum may create suction to cause an optical device under test to be mechanically secured on a top surface of the upper transparent chuck. The testing device may further comprise a photodetector disposed below the lower transparent chuck to detect light that travels through the upper transparent chuck and the lower transparent chuck when one or more probes complete an electrical path that causes the optical device under test to emit the light.

20 Claims, 4 Drawing Sheets

(58) Field of Classification Search
CPC .... G01R 31/62; G01R 31/64; G01R 33/0023; G01R 33/022; G01R 33/07; H01M 10/486; H01M 10/425; H01M 10/48; H01M 10/42; H01M 10/4285; H01M 10/613; H01M 2/26
See application file for complete search history.

310 — Apply a vacuum pump to at least one opening in a sidewall of a structure that supports a lower transparent chuck and an upper transparent chuck that comprises a set of vacuum holes, wherein a space between the lower transparent chuck and the upper transparent chuck defines a chamber in which a vacuum is formed when the vacuum pump is applied to the at least one opening in the sidewall of the structure, and wherein the vacuum formed in the chamber between the lower transparent chuck and the upper transparent chuck creates suction that causes a device under test to be mechanically secured on a top surface of the upper transparent chuck

320 — Detect, by a photodetector disposed below the lower transparent chuck, light that travels through the upper transparent chuck and the lower transparent chuck when one or more probes complete an electrical path that causes the light to be emitted by the device under test

TESTING DEVICE FOR BOTTOM-EMITTING OR BOTTOM-DETECTING OPTICAL DEVICES

RELATED APPLICATION

This application claims the benefit of U.S. Provisional Patent Application No. 62/899,540, entitled "TESTING DEVICE FOR BOTTOM-EMITTING OPTICAL DEVICES," filed Sep. 12, 2019, the content of which is incorporated by reference herein in its entirety.

TECHNICAL FIELD

The present disclosure generally relates to testing optical devices, and more particularly, to a testing device having a transparent chuck design to test bottom-emitting optical devices, bottom-detecting optical devices, and/or the like.

BACKGROUND

A vertical-emitting device, such as a vertical-cavity surface-emitting laser, is a laser in which a laser beam is emitted in a direction perpendicular to a surface of a substrate (e.g., vertically from a surface of a semiconductor wafer). In contrast to edge-emitting devices, vertical-emitting devices may allow for testing to occur at intermediate steps of wafer fabrication.

SUMMARY

According to some implementations, an apparatus may include: a support structure having at least one opening formed in a sidewall; a lower transparent chuck supported by the support structure; an upper transparent chuck supported by the support structure, wherein the upper transparent chuck comprises a set of vacuum holes, wherein a space between the lower transparent chuck and the upper transparent chuck defines a chamber in which a vacuum is formed when a vacuum pump is applied to the at least one opening in the sidewall of the support structure, and wherein the vacuum formed in the chamber between the lower transparent chuck and the upper transparent chuck creates suction that causes a device under test to be mechanically secured on a top surface of the upper transparent chuck; and a photodetector disposed below the lower transparent chuck to detect light that travels through the upper transparent chuck and the lower transparent chuck when one or more probes complete an electrical path that causes the light to be emitted by the device under test.

According to some implementations, an apparatus may include: a support structure having at least one opening formed in a sidewall; a lower transparent chuck supported by the support structure; an upper transparent chuck supported by the support structure, wherein the upper transparent chuck comprises a set of vacuum holes, wherein a space between the lower transparent chuck and the upper transparent chuck defines a chamber in which a vacuum is formed when a vacuum pump is applied to the at least one opening in the sidewall of the support structure, and wherein the vacuum formed in the chamber between the lower transparent chuck and the upper transparent chuck creates suction that causes a device under test to be mechanically secured on a top surface of the upper transparent chuck; a temperature control device in thermal contact with the upper transparent chuck; and a testing device disposed below the lower transparent chuck to perform one or more tests based on light that travels through the upper transparent chuck and the lower transparent chuck after the temperature control device causes the device under test to reach a target temperature.

According to some implementations, a method may include: applying a vacuum pump to at least one opening in a sidewall of a structure that supports a lower transparent chuck and an upper transparent chuck that comprises a set of vacuum holes, wherein a space between the lower transparent chuck and the upper transparent chuck defines a chamber in which a vacuum is formed when the vacuum pump is applied to the at least one opening in the sidewall of the structure, and wherein the vacuum formed in the chamber between the lower transparent chuck and the upper transparent chuck creates suction that causes a device under test to be mechanically secured on a top surface of the upper transparent chuck; and detecting, by a photodetector disposed below the lower transparent chuck, light that travels through the upper transparent chuck and the lower transparent chuck when one or more probes complete an electrical path that causes the light to be emitted by the device under test.

BRIEF DESCRIPTION OF THE DRAWINGS

FIG. 3 is a flowchart of an example process for testing a bottom-emitting and/or bottom-detecting optical device using a testing device having a transparent chuck design.

DETAILED DESCRIPTION

The following detailed description of example implementations refers to the accompanying drawings. The same reference numbers in different drawings may identify the same or similar elements.

Figure 1:
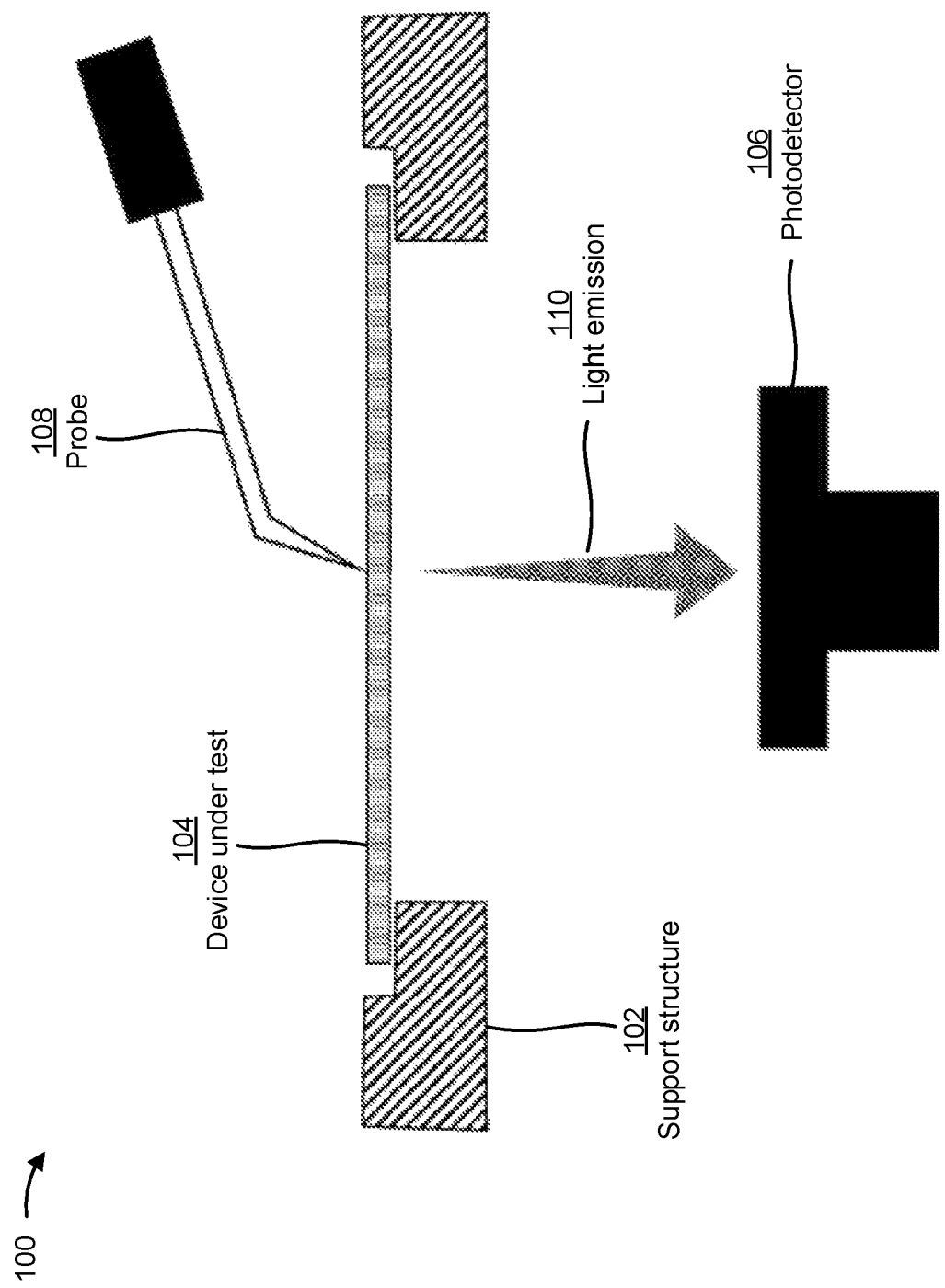
FIG. 1 is a diagram of a testing device for a bottom-emitting optical device and/or a bottom-detecting optical device.

Some vertical-emitting optical devices are top-emitting or top-detecting (e.g., a top-emitting vertical-cavity surface-emitting laser (VCSEL), a top-emitting light emitting diode (LED), and/or the like). In general, top-emitting or top-detecting optical devices tend to be relatively simple to test with a top entry probe tip. For bottom-emitting or bottom-detecting optical devices, however, testing individual devices or a whole wafer may be difficult because test chucks are typically fabricated from opaque materials, such as metal, or other materials that are not transparent to light. Accordingly, one approach to testing a bottom-emitting or bottom-detecting optical device is to use a testing device that does not have a test chuck. For example, FIG. 1 is a diagram of a testing device 100 for a bottom-emitting and/or bottom-detecting optical device. As shown in FIG. 1, the testing device 100 includes a support structure 102 that holds a device under test 104 (e.g., a wafer, an individual device on the wafer, a post-dicing device on blue tape ring, and/or the like) by an edge or outer radius of the device under test 104.

Accordingly, when a probe 108 is used to test the device under test 104 by causing light emission 110 from the device under test 104 (e.g., by touching a tip of the probe 108 to one or more electrical contacts on a top surface of the device under test 104), the omission of a non-transparent test chuck below the device under test 104 allows the light emission 110 to reach a photodetector 106. While the testing device 100 shown in FIG. 1 may be viable for a relatively thick wafer that is mechanically strong enough to be held by the outer radius and probed from a top of the wafer, many production wafers are thinned (e.g., to 100-200 μm in thickness) and are too fragile to be supported only at the outer radius (e.g., without an underlying base) and probed from above without breaking or bowing. Furthermore, when production wafers are thinned, one or more epitaxial layers may have built-in mechanical stress that causes the wafers to not be perfectly flat, which leads to bowing and unreliability related to where one or more probes will land on the uneven surface of the wafer.

Some implementations described herein relate to a testing device that has an upper transparent chuck to support a bottom-emitting and/or bottom-detecting optical device during a test, and a lower transparent chuck arranged such that a space between the upper transparent chuck and the lower transparent chuck form an evacuated chamber to mechanically secure and flatten the optical device against a top surface of the upper transparent chuck when a vacuum pump is applied to the space between the upper transparent chuck and the lower transparent chuck. For example, in some implementations, the testing device may include a support structure to hold or otherwise support the lower transparent chuck and the upper transparent chuck, with the upper transparent chuck having a set of vacuum holes formed therein. Accordingly, when a vacuum pump is applied to an opening in a sidewall of the support structure, a vacuum may be formed in the evacuated chamber to create suction that mechanically secures an optical device under test against the top surface of the upper transparent chuck. Furthermore, the suction created in the evacuated chamber flattens the optical device under test against the top surface of the upper transparent chuck, which prevents the optical device under test from bowing (e.g., when probed from above). In this way, when one or more probes are used to probe the optical device under test, light emission from the bottom of the optical device under test can travel through the transparent chucks to a photodetector or other testing device directly under the optical device under test. In this way, by creating suction to mechanically secure and flatten the optical device under test against a supporting surface, testing of bottom-emitting and/or bottom-detecting optical devices is improved by reducing a risk that the optical device under test will break, bow, or be displaced during testing, by increasing reliability and predictability regarding where one or more probes will land on the surface of the optical device under test, and/or the like.

Figure 2A:
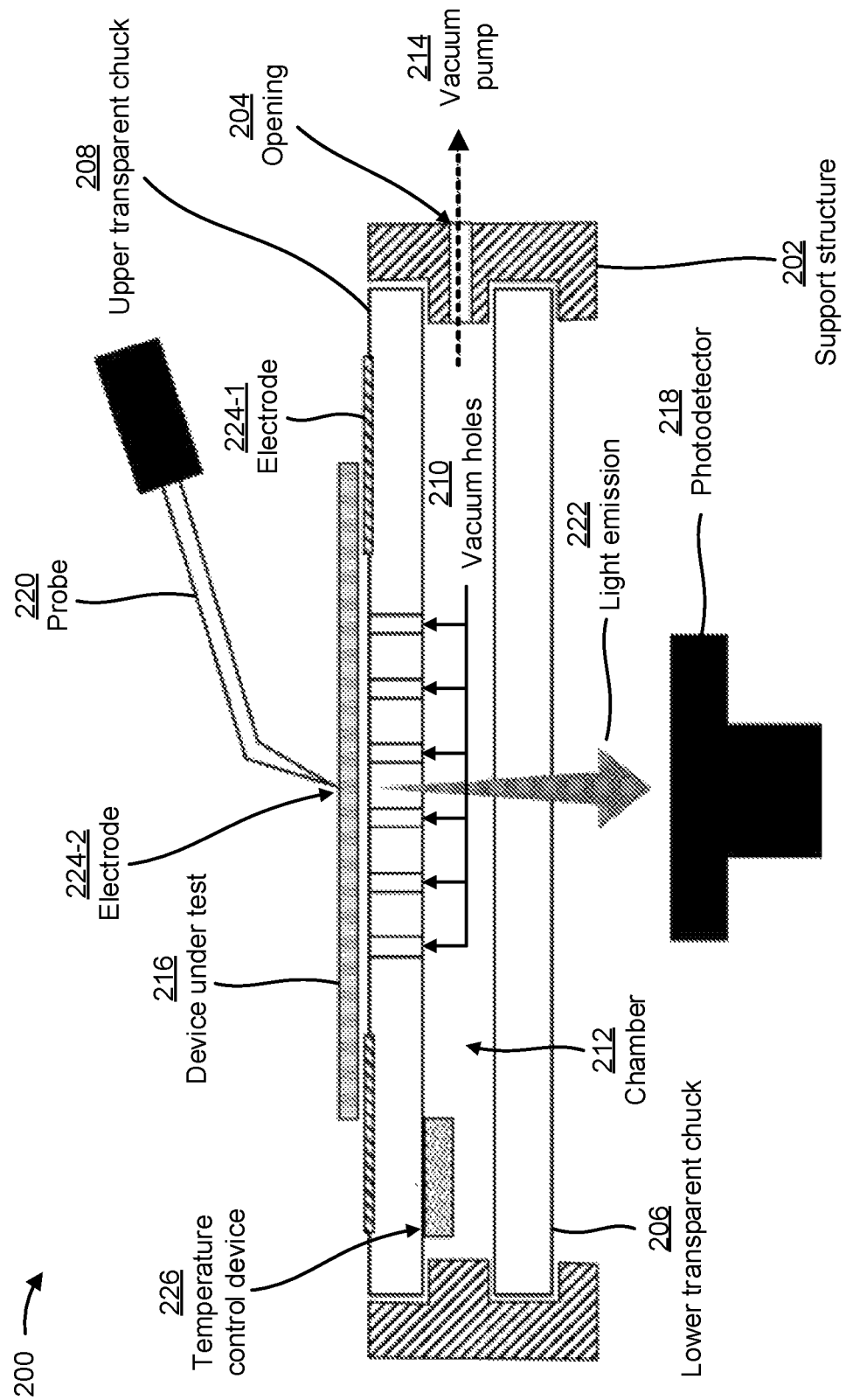
FIGS. 2A-2B are diagrams of one or more example implementations of a testing device having a transparent chuck design to test a bottom-emitting and/or bottom-detecting optical device.
Figure 2B:
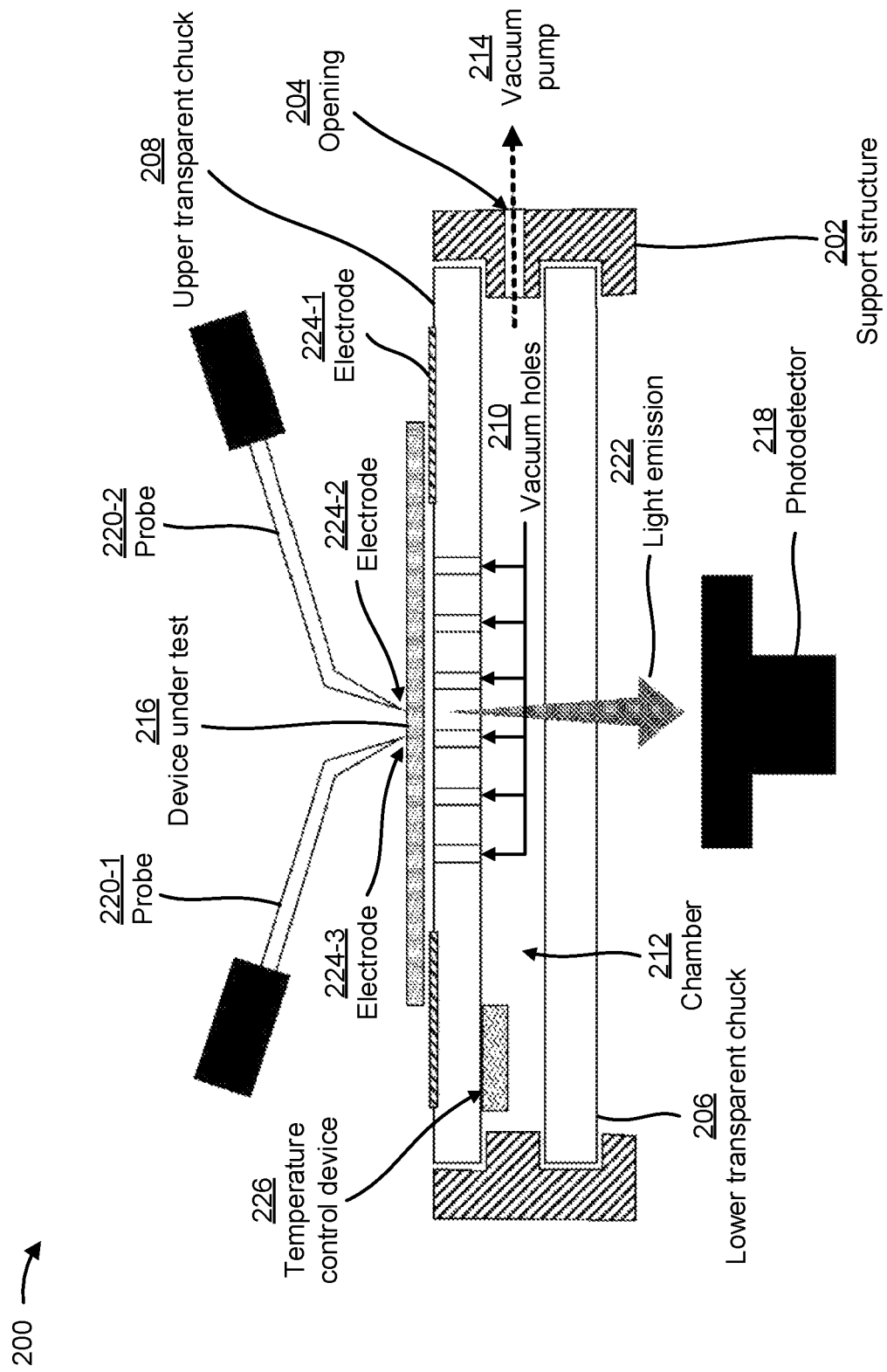

FIGS. 2A-2B are diagrams of one or more example implementations of a testing device 200 having a transparent chuck design to test a bottom-emitting and/or bottom-detecting optical device. In general, FIGS. 2A-2B illustrate cross-sectional views of the testing device 200, which may be used for testing an optical device under test 216, such as a bottom-emitting optical device or optical wafer, a bottom-detecting optical device or wafer, and/or the like.

For example, as shown in FIGS. 2A-2B, the testing device 200 may include a support structure 202 having at least one opening 204 formed in a sidewall, a lower transparent chuck 206 supported by the support structure 202, and an upper transparent chuck 208 supported by the support structure. In some implementations, the lower transparent chuck 206 and the upper transparent chuck 208 may be a single transparent chuck. In this case, the lower transparent chuck 206 may be a lower portion of the single transparent chuck, and the upper transparent chuck 208 may be an upper portion of the single transparent chuck. Alternatively, in some implementations, the lower transparent chuck 206 and the upper transparent chuck 208 may be separate components. As further shown in FIGS. 2A-2B, the upper transparent chuck has a set of vacuum holes 210, and a space between the lower transparent chuck 206 and the upper transparent chuck 208 defines a chamber 212 in which a vacuum is formed when a vacuum pump 214 is applied to the at least one opening 204 in the sidewall of the support structure 202. For example, when the vacuum pump 214 is applied to the at least one opening 204 in the sidewall of the support structure 202, the vacuum formed in the chamber 212 between the lower transparent chuck 206 and the upper transparent chuck 208 creates suction through the vacuum holes 210 in the upper transparent chuck 208, which causes an optical device under test 216 to be mechanically secured on a top surface of the upper transparent chuck 208.

Accordingly, as shown in FIGS. 2A-2B, a photodetector 218 (or another suitable optical testing device) may be disposed below the lower transparent chuck 206 to detect light emission 222 that travels through the upper transparent chuck 208 and the lower transparent chuck 206 when one or more probes 220 complete an electrical path to cause the light emission 222 from the optical device under test 216. For example, in some implementations, the upper transparent chuck 208 and the lower transparent chuck 206 may have one or more regions that are transparent to light such that the light emission 222 can pass through both transparent chucks 206, 208 to reach the photodetector 218 disposed below the lower transparent chuck 206. In some implementations, the lower transparent chuck 206 and the upper transparent chuck 208 may have an anti-reflective coating to minimize reflection of the light emission 222 from the optical device under test 216, which reduces the noise in light output measurement at the photodetector 218 and results in more accurate measured values. Furthermore, in some implementations, the photodetector 218 may be a large area photodetector located under the lower transparent chuck 206 to detect substantially all light emission 222 from the optical device under test 216 (e.g., light that travels through the upper transparent chuck 208 and then through the lower transparent chuck 206) even with distortion. Additionally, or alternatively, a beam splitter may be disposed under the lower transparent chuck 206 to steer part of the light emission 222 to the photodetector 218 and to steer other parts of the light emission 222 to other optical testing devices (e.g., an integrating sphere, a high-resolution camera, and/or the like).

In some implementations, the upper transparent chuck 208 and the lower transparent chuck 206 may be made from a material that is transparent to light and also has a hardness (e.g., based on the Mohs scale) to withstand the vacuum formed when the vacuum pump 214 is applied to the at least one opening 204 in the sidewall of the support structure 202. Additionally, or alternatively, the upper transparent chuck 208 and the lower transparent chuck 206 may be made from a material that has a thermal conductivity that satisfies a threshold to enable heat to be transferred to and/or conducted away from the optical device under test 216, as described in more detail below. For example, in some implementations, the lower transparent chuck 206 and the upper transparent chuck 208 may be made from sapphire (which is a mechanically robust material with a high thermal conductivity), a relatively thick quartz, glass, and/or the like. Furthermore, in some implementations, the lower transparent chuck 206 and the upper transparent chuck 208 may be made from the same material or from different materials (e.g., a high thermal conductivity may be unnecessary for the lower transparent chuck 206 that is not in contact with the optical device under test 216), and areas of the lower transparent chuck 206 and the upper transparent chuck 208 outside the one or more regions where the light emission 222 is to pass through may be transparent to light, translucent, opaque, and/or the like.

In some implementations, as described above, a vacuum pump 214 may be applied to the opening 204 in the sidewall of the support structure 202 to form a vacuum in the chamber 212 between the lower transparent chuck 206 and the upper transparent chuck 208. In some implementations, the upper transparent chuck 208 may include one or more vacuum holes 210 formed (e.g., drilled) through the upper transparent chuck 208 such that the vacuum in the chamber 212 between the lower transparent chuck 206 and the upper transparent chuck 208 causes the optical device under test 216 to be flattened and suctioned against an electrode 224-1 (e.g., an electrical contact) on the top surface of the upper transparent chuck 208, which prevents the optical device under test 216 from bowing when probed from above. In some implementations, the one or more vacuum holes 210 may be formed through the upper transparent chuck 208 according to a pattern that is based on a layout of the optical device under test 216. For example, the vacuum holes 210 may be formed based on a layout of active devices on the optical device under test 216 (e.g., to cause the light emission 222 to pass through the upper transparent chuck 208, to cause the light emission 222 to pass through one or more of the vacuum holes 210, and/or the like).

In some implementations, the electrode 224-1 may include a layer of electrically conducting material (e.g., gold, silver, and/or the like) in the shape of a ring that contacts an outer radius of the optical device under test 216. Accordingly, as shown in FIG. 2A, an electrical path to cause the light emission 222 from the optical device under test 216 may be completed by touching a tip of the probe 220 to an electrode 224-2 on top of the optical device under test 216 while the bottom or substrate of the optical device under test 216 is suctioned against the electrode 224-1 on the top surface of the upper transparent chuck 208. Alternatively, as shown in FIG. 2B, two (or more) probes 220-1, 220-2 can be used if both a cathode (or n contact) and an anode (orp contact) are on the top surface of one or more light-emitting devices (e.g., VCSELs, LEDs, lasers, and/or the like) that are formed on the optical device under test 216. In this case, the electrical path to drive light emission 222 from the light-emitting devices can be completed by contacting tips of the two probes 220-1, 220-2 against two electrodes 224-2, 224-3 on the top surface of the one or more light-emitting devices (e.g., corresponding to the cathode and the anode, or vice versa) without having to go through the electrode 224-1 on the top surface of the upper transparent chuck 208. In such cases, the electrode 224-1 on the top surface of the upper transparent chuck 208 can be omitted, used to provide a ground plane, and/or the like.

In some implementations, as further shown in FIGS. 2A-2B, the testing device 200 may include a temperature control device 226 in thermal contact with the upper transparent chuck 208 to enable testing the optical device under test 216 at different temperatures. For example, conventional approaches to test over temperature typically direct a hot or cold air stream to devices positioned adjacent to a probe tip to locally heat or cool certain areas just prior to testing. However, this approach of local heating and/or cooling tends to be inefficient and time-consuming. Accordingly, the temperature control device 226 may be arranged to be in thermal contact with the upper transparent chuck 208 such that the entire optical device under test 216 can be heated or cooled to a target temperature prior to testing (e.g., prior to the one or more probes 220-1, 220-2, and/or the like completing the electrical path that causes the light emission 222 from the optical device under test 216). For example, as shown in FIGS. 2A-2B, the temperature control device 226 may be disposed in the chamber 212 between the lower transparent chuck 206 and the upper transparent chuck 208, and may be in thermal contact with the upper transparent chuck 208 so as to transfer heat to and/or conduct heat away from the upper transparent chuck 208, which may heat or cool the optical device under test 216 that is secured against the top surface of the upper transparent chuck 208. For example, in some implementations, the temperature control device 226 may be a heating element such as a thin-film heater, a cooling element such as a thermoelectric cooler, and/or the like. In the latter case, the cooling element may be in contact with the support structure 202, which may act as a heatsink to conduct heat away from the upper transparent chuck 208 (and thus the optical device under test 216). Furthermore, as described above, the upper transparent chuck 208 may be formed from a material such as sapphire that is transparent, mechanically robust, and has a high thermal conductivity that satisfies a threshold, which enables heat to be efficiently transferred to and/or conducted away from the upper transparent chuck 208. Additionally, or alternatively, the temperature control device 226 may be integrated into the upper transparent chuck 208 (e.g., as a grid to make the upper transparent chuck 208 more thermally uniform).

As indicated above, FIGS. 2A-2B are provided merely as one or more examples. Other examples may differ from what is described with regard to FIGS. 2A-2B.

FIG. 3 is a flowchart of an example process 300 for testing a bottom-emitting and/or bottom-detecting optical device using a testing device having a transparent chuck design.

As shown in FIG. 3, process 300 may include applying a vacuum pump to at least one opening in a sidewall of a structure that supports a lower transparent chuck and an upper transparent chuck that comprises a set of vacuum holes, wherein a space between the lower transparent chuck and the upper transparent chuck defines a chamber in which a vacuum is formed when the vacuum pump is applied to the at least one opening in the sidewall of the structure, and wherein the vacuum formed in the chamber between the lower transparent chuck and the upper transparent chuck creates suction that causes an optical device under test to be mechanically secured on a top surface of the upper transparent chuck (block 310).

For example, as described above, a vacuum pump 214 may be applied to at least one opening 204 in a sidewall of a structure 202 that supports a lower transparent chuck 206 and an upper transparent chuck 208 that comprises a set of vacuum holes 210. In some implementations, a space between the lower transparent chuck 206 and the upper transparent chuck 208 defines a chamber 212 in which a vacuum is formed when the vacuum pump 214 is applied to the at least one opening 204 in the sidewall of the structure 202. In some implementations, the vacuum formed in the chamber 212 between the lower transparent chuck 206 and the upper transparent chuck 206 creates suction that causes an optical device under test 216 to be mechanically secured on a top surface of the upper transparent chuck 208.

As further shown in FIG. 3, process 300 may include detecting, by a photodetector disposed below the lower transparent chuck, light that travels through the upper transparent chuck and the lower transparent chuck when one or more probes complete an electrical path that causes the light to be emitted by the optical device under test (block 320). For example, as described above, a photodetector 218 disposed below the lower transparent chuck 206 may detect light emission 222 that travels through the upper transparent chuck 208 and the lower transparent chuck 206 when one or more probes 220 complete an electrical path that causes the light emission 222 by the optical device under test 216.

Process 300 may include additional implementations, such as any single implementation or any combination of implementations described below and/or in connection with one or more other processes described elsewhere herein.

In a first implementation, process 300 may further include causing the optical device under test 216 to be heated or cooled to a target temperature using a temperature control device 226 in thermal contact with the upper transparent chuck 208. For example, in some implementations, the temperature control device 226 causes the optical device under test 216 to be heated or cooled to the target temperature prior to the one or more probes 220 completing the electrical path that causes the light emission 222 by the optical device under test 216.

In a second implementation, alone or in combination with the first implementation, the one or more probes 220 complete the electrical path that causes the light emission 222 by the optical device under test 216 when the one or more probes 220 are in contact with a first electrode 224-2 on a top surface of the optical device under test 216 while the optical device under test 216 is in contact with a second electrode 224-1 on a top surface of the upper transparent chuck 208.

In a third implementation, alone or in combination with one or more of the first and second implementations, the one or more probes comprise a first probe 220-1 and a second probe 220-2, which complete the electrical path that causes the light emission 222 by the optical device under test 216 when the first probe 220-1 is in contact with a first electrode 224-3 on a top surface of the optical device under test 216 while the second probe 220-2 is in contact with a second electrode 224-2 on the top surface of the optical device under test 216.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, satisfying a threshold may, depending on the context, refer to a value being greater than the threshold, greater than or equal to the threshold, less than the threshold, less than or equal to the threshold, equal to the threshold, not equal to the threshold, and/or the like.

As used herein the term "layer" is intended to be broadly construed as one or more layers and includes layers oriented horizontally, vertically, or at other angles.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An apparatus, comprising:
   a support structure having at least one opening formed in a sidewall;
   a lower transparent chuck supported by the support structure;
   an upper transparent chuck supported by the support structure,
     wherein the upper transparent chuck comprises a set of vacuum holes,
     wherein a space between the lower transparent chuck and the upper transparent chuck defines a chamber in which a vacuum is formed when a vacuum pump is applied to the at least one opening in the sidewall of the support structure, and
     wherein the vacuum formed in the chamber between the lower transparent chuck and the upper transparent chuck creates suction that causes an optical device under test to be mechanically secured on a top surface of the upper transparent chuck; and
   a photodetector disposed below the lower transparent chuck to detect light that travels through the upper transparent chuck and the lower transparent chuck when one or more probes complete an electrical path that causes the light to be emitted by the optical device under test.

2. The apparatus of claim 1, further comprising:
   a first electrode on the top surface of the upper transparent chuck,
   wherein the optical device under test has a second electrode on a top surface, and
   wherein the one or more probes complete the electrical path that causes the light to be emitted by the optical device under test when the one or more probes are in contact with the second electrode on the top surface of the optical device under test while the optical device under test is in contact with the first electrode on the top surface of the upper transparent chuck.

3. The apparatus of claim 1, wherein:
   the one or more probes comprise at least a first probe and a second probe, and
   the one or more probes complete the electrical path that causes the light to be emitted by the optical device under test when the first probe is in contact with a first electrode on a top surface of the optical device under test while the second probe is in contact with a second electrode on the top surface of the optical device under test.

4. The apparatus of claim 1, further comprising:
a heating element in thermal contact with the upper transparent chuck to cause the optical device under test to be heated to a target temperature prior to the one or more probes completing the electrical path that causes the optical device under test to emit the light.

5. The apparatus of claim 1, further comprising:
a cooling element in thermal contact with the upper transparent chuck and the support structure to conduct heat away from the optical device under test prior to the one or more probes completing the electrical path that causes the optical device under test to emit the light.

6. The apparatus of claim 1, wherein one or more of the lower transparent chuck or the upper transparent chuck has an anti-reflective coating.

7. The apparatus of claim 1, wherein the vacuum formed in the chamber between the lower transparent chuck and the upper transparent chuck causes the optical device under test to be flattened against the top surface of the upper transparent chuck to prevent the optical device under test from bowing when contacted from above by the one or more probes.

8. The apparatus of claim 1, wherein one or more of the lower transparent chuck or the upper transparent chuck are formed from a material having one or more of a thermal conductivity that satisfies a threshold or a hardness to withstand the vacuum formed when the vacuum pump is applied to the at least one opening in the sidewall of the support structure.

9. The apparatus of claim 1, wherein the set of vacuum holes are formed in the upper transparent chuck according to a pattern that is based on a layout of the optical device under test.

10. The apparatus of claim 1, wherein the optical device under test comprises a vertical-cavity surface-emitting laser device configured to emit the light.

11. An apparatus, comprising:
a support structure having at least one opening formed in a sidewall;
a lower transparent chuck supported by the support structure;
an upper transparent chuck supported by the support structure,
wherein the upper transparent chuck comprises a set of vacuum holes,
wherein a space between the lower transparent chuck and the upper transparent chuck defines a chamber in which a vacuum is formed when a vacuum pump is applied to the at least one opening in the sidewall of the support structure, and
wherein the vacuum formed in the chamber between the lower transparent chuck and the upper transparent chuck creates suction that causes an optical device under test to be mechanically secured on a top surface of the upper transparent chuck;
a temperature control device in thermal contact with the upper transparent chuck; and
a testing device disposed below the lower transparent chuck to perform one or more tests based on light that travels through the upper transparent chuck and the lower transparent chuck after the temperature control device causes the optical device under test to reach a target temperature.

12. The apparatus of claim 11, wherein the temperature control device comprises a heating element in thermal contact with the upper transparent chuck to cause the optical device under test to be heated to the target temperature prior to one or more probes completing an electrical path that causes the light to be emitted by the optical device under test.

13. The apparatus of claim 12, wherein the heating element is a thin-film heater.

14. The apparatus of claim 11, wherein the temperature control device comprises a cooling element in thermal contact with the upper transparent chuck and the support structure to conduct heat away from the optical device under test prior to one or more probes completing an electrical path that causes the light to be emitted by the optical device under test.

15. The apparatus of claim 14, wherein the cooling element is a thermoelectric cooler.

16. The apparatus of claim 11, wherein the upper transparent chuck is formed from a material having a thermal conductivity that satisfies a threshold.

17. A method, comprising:
applying a vacuum pump to at least one opening in a sidewall of a structure that supports a lower transparent chuck and an upper transparent chuck that comprises a set of vacuum holes,
wherein a space between the lower transparent chuck and the upper transparent chuck defines a chamber in which a vacuum is formed when the vacuum pump is applied to the at least one opening in the sidewall of the structure, and
wherein the vacuum formed in the chamber between the lower transparent chuck and the upper transparent chuck creates suction that causes an optical device under test to be mechanically secured on a top surface of the upper transparent chuck; and
detecting, by a photodetector disposed below the lower transparent chuck, light that travels through the upper transparent chuck and the lower transparent chuck when one or more probes complete an electrical path that causes the light to be emitted by the optical device under test.

18. The method of claim 17, further comprising:
causing the optical device under test to be heated or cooled to a target temperature using a temperature control device in thermal contact with the upper transparent chuck,
wherein the temperature control device causes the optical device under test to be heated or cooled to the target temperature prior to the one or more probes completing the electrical path that causes the light to be emitted by the optical device under test.

19. The method of claim 17, wherein the one or more probes complete the electrical path that causes the optical device under test to emit the light when the one or more probes are in contact with a first electrode on a top surface of the optical device under test while the optical device under test is in contact with a second electrode on a top surface of the upper transparent chuck.

20. The method of claim 17, wherein:
the one or more probes comprise a first probe and a second probe, and
the one or more probes complete the electrical path that causes the light to be emitted by the optical device under test when the first probe is in contact with a first electrode on a top surface of the optical device under test while the second probe is in contact with a second electrode on the top surface of the optical device under test.

* * * * *